United States Patent

Mino et al.

[11] Patent Number: 5,997,698
[45] Date of Patent: Dec. 7, 1999

[54] PROCESS FOR FABRICATING SOFT MAGNETIC THIN FILMS

[75] Inventors: Tetsuya Mino, Chiba; Yasufumi Uno, Nagano, both of Japan

[73] Assignee: TDK Corporation, Tokyo, Japan

[21] Appl. No.: 08/933,138

[22] Filed: Sep. 18, 1997

[30] Foreign Application Priority Data

Sep. 19, 1996 [JP] Japan ................................. 8-269449

[51] Int. Cl.$^6$ ............................. C23C 14/00; C23C 14/34
[52] U.S. Cl. .............................. 204/192.2; 204/192.12; 204/192.15
[58] Field of Search ................... 204/192.12, 192.15, 204/192.2, 192.3, 298.06, 298.28; 216/27

[56] References Cited

U.S. PATENT DOCUMENTS

| | | | |
|---|---|---|---|
| 5,117,321 | 5/1992 | Nakanishi et al. | 360/119 |
| 5,240,583 | 8/1993 | Ahonen | 204/298.04 |
| 5,262,915 | 11/1993 | Terunuma et al. | 428/694 |
| 5,382,305 | 1/1995 | Terunuma et al. | 148/306 |
| 5,384,021 | 1/1995 | Thwaites | 204/298.21 |
| 5,403,457 | 4/1995 | Nago et al. | 204/192.2 |
| 5,473,492 | 12/1995 | Terunuma et al. | 360/128 |

FOREIGN PATENT DOCUMENTS

| | | |
|---|---|---|
| 3-1513 | 1/1991 | Japan. |
| 6-259729 | 9/1994 | Japan. |
| 7-60767 | 6/1995 | Japan. |

*Primary Examiner*—Yogendra Gupta
*Assistant Examiner*—Brian P. Mruk
*Attorney, Agent, or Firm*—Oblon, Spivak, McClelland, Maier & Neustadt, P.C.

[57] ABSTRACT

An Fe—Zr—N base thin film composed of a metal nitride is formed by reactive sputtering. At the reactive sputtering step, the stress of the thin film is controlled by causing relative movement of the substrate with respect to a target in such a manner that the substrate can be periodically opposite to the target, or applying a negative bias voltage to the substrate, or performing said relative movement of the substrate with the application of the negative bias voltage to the substrate.

10 Claims, 5 Drawing Sheets

PROCESS FOR FABRICATING SOFT MAGNETIC THIN FILMS

BACKGROUND OF THE INVENTION

The present invention relates to a process for fabricating soft magnetic thin films which are primarily applied to various magnetic heads including an induction type magnetic head, a magnetoresistance type magnetic head (MR head), and an MR induction type composite head having an induction head portion and an MR head portion.

In recent years, magnetic recording of much higher density than ever before has been put forward. With this, thin film magnetic heads using soft magnetic thin films as magnetic poles, and reproducing MR heads making use of magnetoresistance effect have been under remarkable developments.

An MR head is designed to read external magnetic signals through a resistance change in a reading sensor formed of magnetic material. A characteristic feature of the MR head is that high outputs are achievable even when magnetic recording is performed at high linear densities because outputs are not dependent on its relative speed with respect to a recording medium. To increase resolving power and obtain good-enough properties at high frequencies, the MR head is usually constructed by sandwiching a magnetoresistance film (an MR film) between a pair of magnetic shielding films (a shielded MR head).

For the MR head that is a reproducing head, an MR induction type composite head is used, in which an MR head portion is provided in the form of an integral piece of an induction type head portion for recording purposes.

For magnetic shielding films or magnetic poles in the MR heads or the MR induction type composite heads, it is preferable to use thin films excellent in soft magnetic properties. Fe—Zr—N base soft magnetic thin films set forth in JP-B 7-60767 and JP-A 3-1513, for instance, are available to this end.

MR films are generally of low heat resistance. In particular, multilayer films having giant magnetoresistance (GMR) effect (artificial lattice films composed of a laminate of thin films each having a thickness of about 5 nm) are likely to undergo considerable degradation because mutual dispersion occurs between thin films upon heated. It is thus required that annealing for the purpose of improving the soft magnetic properties of magnetic shielding films or magnetic poles be done at temperatures below 300° C.

In the case of metal nitride thin films such as the aforesaid Fe—Zr—N base thin films, however, stress relieving cannot be achieved unless they are thermally treated at a temperature of at least 300° C. This is because their compressive stresses are increased by the penetration of the light element N between metallic lattices. In the publications mentioned above, it is at an annealing temperature greater than 350° C. when practical soft magnetic properties are obtainable, although such publications make no reference to film stresses. Generally speaking, a problem with a thin film, of which compressive stress is not fully relieved, is that when applied to a relatively thick portion such as a magnetic pole in the induction type head portion or a magnetic shielding film in the MR head portion, it is often delaminated from an underlaid insulating layer, or otherwise other films peel off. Another problem is that it is difficult to obtain satisfactory soft magnetic properties due to the influence of magnetostriction.

A soft magnetic thin film, when it is actually applied to a magnetic pole or magnetic shield in a magnetic head, is not only strongly affected by the stress of an underlaid insulating layer, etc., but also affected by the stresses of upper layers that are formed on the soft magnetic thin film. It follows that even if the soft magnetic thin film has reduced stress in itself, it is not always possible to prevent it from peeling off or better its soft magnetic properties.

When forming a soft magnetic thin film that is applied to a magnetic head having an MR head portion and so should be thermally treated at a temperature below 300° C., therefore, it is required to control forming conditions so as to impart the optimum stress to it depending on layers formed under or over it, thereby preventing its delamination from the underlaid layer and achieving good-enough soft magnetic properties.

Thus, it is an object of the present invention to provide a process for fabricating a soft magnetic thin film that is applied to a magnetic shielding film or magnetic pole in an MR head or an MR induction type composite head including a reproducing MR head portion and a recording induction head portion, wherein said soft magnetic thin film can be stress controlled without applying any high-temperature annealing thereto.

SUMMARY OF THE INVENTION

Such an object is achieved by the present invention defined as below (1) to (5).

(1) A process for fabricating a soft magnetic thin film, which comprises a step of:

forming a thin film composed of a metal nitride on a substrate by means of reactive sputtering, wherein said thin film is stress controlled at said reactive sputtering step by causing relative movement of said substrate with respect to a target in such a manner that said substrate is periodically opposite to said target, or applying a negative bias voltage to said substrate, or performing said relative movement with application of said negative bias voltage to said substrate.

(2) The process for fabricating a soft magnetic thin film according to the above (1), wherein said relative movement of said substrate is performed while said substrate is held on a rotating substrate holder at a position having an off-axis relation to an rotary shaft thereof and said target is fixed at a position that has an off-axis relation to the rotary shaft of said substrate holder and can be periodically opposite to said substrate in association with rotation of said substrate holder.

(3) The process for fabricating a soft magnetic thin film according to the above (1) or (2), wherein:

a thin film is formed by said reactive sputtering, said thin film containing iron or Fe, M (representing at least one element selected from the group consisting of magnesium or Mg, calcium or Ca, yttrium or Y, titanium or Ti, zirconium or Zr, hafnium or Hf, vanadium or V, niobium or Nb, tantalum or Ta, chromium or Cr, molybdenum or Mo, tungsten or W, manganese or Mn, and boron or B), and nitrogen or N, and having a I(200)/I (110) ratio of less than 0.1 with the proviso that I(200), and I(110) represent an intensity of a diffraction peak for an iron (200) plane, and an iron (110) plane, respectively, as found from an X-ray diffraction pattern, and said thin film is then annealed at 100 to 280° C. to obtain a soft magnetic thin film having a composition represented by formula $(Fe_{1-x}M_x)_{1-y}N_y$ wherein an atomic ratio x is $0.01 \leq x \leq 0.1$ and an atomic ratio y is $0.01 \leq y \leq 0.1$, and having a I(200)/I(110) ratio of 0.1 inclusive to 1 exclusive and being substantially free from a diffraction peak for a nitride of M, as found from an X-ray diffraction pattern.

(4) The process for fabricating a soft magnetic thin film according to any one of the above (1) to (3), wherein said soft magnetic thin film is applied to at least a portion of at least one of a pair of magnetic poles in a magnetic head comprising an induction head portion having said pair of magnetic poles.

(5) The process for fabricating a soft magnetic thin film according to any one of the above (1) to (4), wherein said soft magnetic thin film is applied to at least a portion of at least one magnetic shielding film in a magnetic head comprising a magnetoresistance head portion having a magnetoresistance film and said at least one magnetic shielding film.

BRIEF EXPLANATION OF THE DRAWINGS

For the purpose of illustration alone, the present invention will now be explained more specifically with reference to the accompanying drawings, in which.

DETAILED DESCRIPTION OF THE PREFERRED EMBODIMENTS

In the practice of the present invention, a thin film composed of a metal nitride is formed on a substrate by means of reactive sputtering, during which the substrate is moved relatively to a target and/or a negative bias voltage is applied to the substrate.

Figure 5:
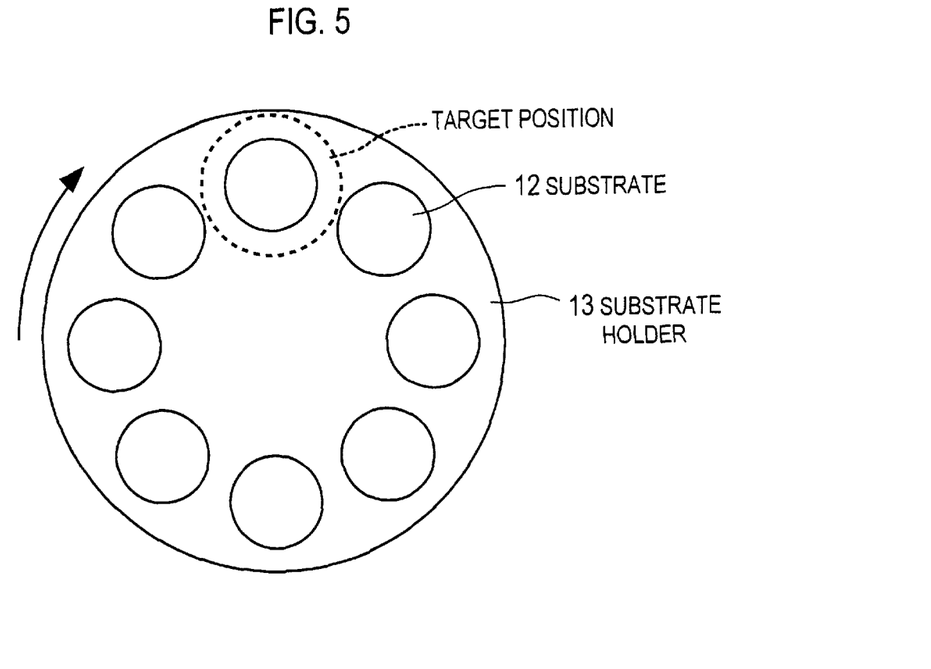
FIG. 5 is a plan schematic illustrative of a substrate holder in a sputtering system used in the present invention.

When, for instance, reactive DC sputtering is carried out while the substrate is moved relatively to the target, the stress of the thin film moves generally in a tensile direction. When, on the other hand, reactive DC sputtering is carried out while a negative bias voltage is applied via RF power to the substrate, the stress of the thin film moves generally in a compressive direction. When the substrate is subjected to the orbital motion as shown typically in FIG. 5, the stress of the thin film changes as depicted typically in FIG. 6. In other words, when a thin film formed on the substrate kept in a stationary state has compressive stress (with a minus sign), stress is moved by the rotation of the substrate in the tensile direction to reduce the compressive stress, so that tensile stress (with a plus sign) can eventually occur with an increase in the rotating speed. When, on the other hand, a thin film formed on the substrate with no bias voltage applied thereto has tensile stress, stress is moved by the application of a negative bias voltage in the compressive direction to reduce the tensile stress, so that compressive stress can eventually occur with an increase in the negative bias voltage applied.

When reactive sputtering is performed using nitrogen as a reactive gas according to the present invention, it is possible to control the stress of a soft magnetic thin film at a width of about $5 \times 10^{10}$ dyn/cm$^2$ at maximum (with a lower limit of about $-4 \times 10^{10}$ dyn/cm$^2$ and an upper limit of about $1 \times 10^{10}$ dyn/cm$^2$) by the relative movement of the substrate and/or the application of a negative bias voltage to the substrate, as already mentioned. In some cases, insulating layers provided on upper and lower sides of a magnetic pole differ from those formed on upper and lower sides of a magnetic shielding film in terms of thickness, shape, and material. The magnetic pole and magnetic shielding film, too, often differ from each other in terms of thickness. For these reasons, there is a difference in the optimum stress between the magnetic pole and the magnetic shielding film. In either case, the present invention makes it possible to obtain a soft magnetic thin film having the optimum stress. In other words, the present invention makes it possible to control the stress of a soft magnetic thin film with no application of any annealing, thereby preventing any delamination of the soft magnetic thin film, and of other thin films laminated thereon as well, and improving the soft magnetic properties of the soft magnetic thin film.

According to the present invention, an Fe—Zr—N base soft magnetic thin film having soft magnetic properties equivalent to or higher than those of a conventional Fe—Zr—N base soft magnetic thin film that must be annealed at 350° C. or higher can be obtained even upon annealed at a low temperature below 300° C., if the composition is within the range mentioned above and the intensity ratio or I(200)/I(110) of diffraction peaks in an X-ray diffraction pattern is within the range mentioned above, as measured just after the formation of the film and after annealing.

The metal nitride thin film, especially the Fe—Zr—N base soft magnetic thin film formed according to the present invention may be applied to a magnetic pole or magnetic shielding film in MR heads or an MR induction type of composite heads. A conventional Fe—Zr—N base soft magnetic thin film is found to undergo considerable degradation when it is applied in the form of an MR film to a magnetic head comprising an MR head portion, because it must be annealed at a temperature of at least 350° C. to obtain good-enough soft magnetic properties. However, the soft magnetic thin film formed according to the present invention can successfully provide an MR film unlikely to undergo degradation, because the thin film is annealed at a temperature low-enough to ensure prevention of degradation of the MR film. Since a magnetic shielding film 6 on a trailing side is formed after the formation of a magnetoresistance (MR) film 5 as shown typically in FIG. 1, the MR film is also heated when the magnetic shielding film on the trailing side is annealed. For this reason, the aforesaid soft magnetic thin film is particularly suitable for use on the trailing-side magnetic shielding film in an MR head portion. For similar reason, the soft magnetic thin film is also suitable for use on magnetic poles 81 and 82 on trailing and leading sides, respectively.

The soft magnetic thin film, especially that based on Fe—Zr—N, formed according to the present invention is hardly elongated due to its low ductility. In this regard, this soft magnetic thin film is suitable for the magnetic shielding film on the leading side. When a permalloy film is used for the magnetic shielding film on the leading side, the permalloy film is elongated owing to coming in contact or collision with a recording medium such as a hard disk, often giving rise to a short circuit between it and an MR film. By use of the aforesaid soft magnetic film, however, it is possible to prevent such a short circuit and so achieve excellent durability. A sendust film of low ductility, too, causes damage to an MR film because the sendust film must be annealed at 400° C. or higher so as to obtain soft magnetic properties. In contrast, the aforesaid soft magnetic thin film has little, if any, influence on the MR film because only annealing at a temperature below 300° C. is needed. In addition, magnetic shielding properties obtained by use of this soft magnetic thin film are equivalent to or higher than those obtained by use of a permalloy, or a sendust film which has been annealed at a high temperature.

A conventional Fe—Zr—N base soft magnetic thin film offers a certain problem in connection with corrosion resistance because the precipitation of ZrN induces the precipitation of α-Fe, as will be described later. However, the soft magnetic thin film according to the present invention has good-enough corrosion resistance because of no precipitation of ZrN. Therefore, this soft magnetic thin film is unlikely to undergo corrosion even when water is used in magnetic head fabrication processes.

Figure 2:
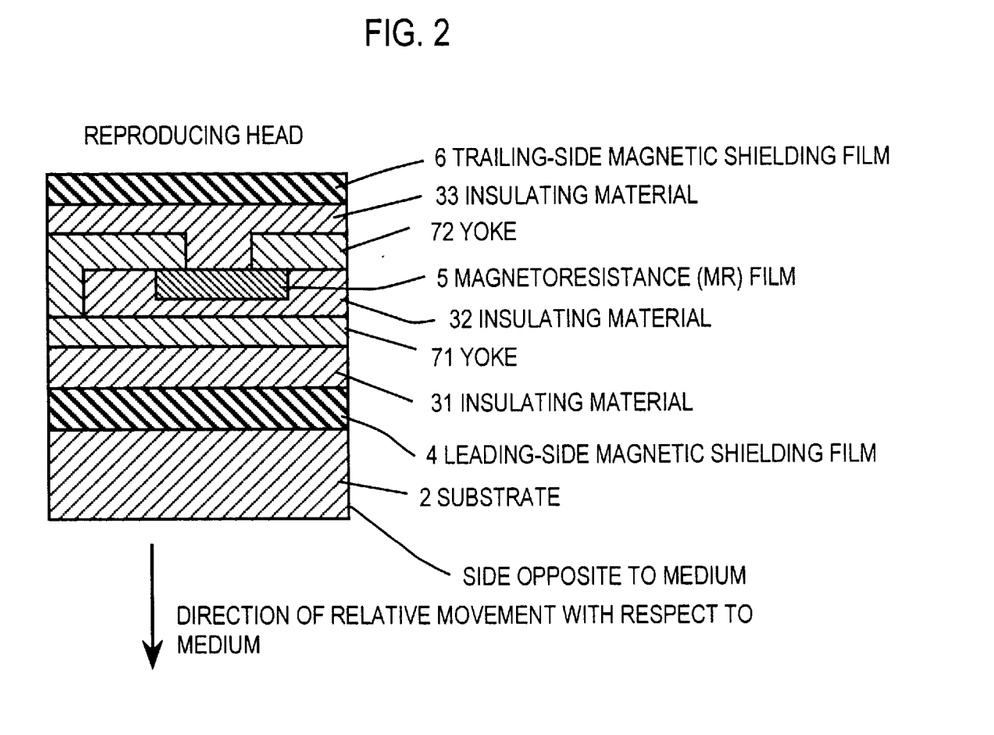
FIG. 2 is a sectional view of one exemplary MR head arrangement.

JP-A 2-121312 discloses a sputtering process, wherein a substrate to form a magnetic thin film thereon is disposed on a rotary table at a position having an off-axis relation to a rotary shaft thereof and, with a negative bias voltage applied to the substrate, a magnetic material is sputtered on the substrate using a sputtering system having a target disposed in off-axis relation to the rotary shaft of the rotary table. This process has some resemblance to the process of the present invention in that the negative bias voltage is applied to the substrate while the substrate is orbited. The effect of the invention set forth in the aforesaid publication is that uniaxial magnetic anisotropy is imparted to a magnetic thin film by inverse magnetostrictive effect. The publication does not refer to reactive sputtering; it makes a mere reference to Fe—Ni alloys (permalloy). In these points, the present invention is distinguishable over the invention set forth in that publication. FIG. 2 of the publication is a graph illustrative of an internal stress change depending on a change in the bias voltage applied to a substrate. However, this stress change is on the order of barely about $4 \times 10^9$ dyn/cm$^2$, and is much smaller than that achieved in the present invention. For a magnetic head or other like structure having a multiplicity of layers laminated on upper and lower sides of a soft magnetic thin film, it is required that the soft magnetic thin film can bear a wide range of stresses depending on the material, and thickness of other layers. However, the soft magnetic thin film set forth in the publication is expected to fail often to bear such stresses because its stress change range is narrow. It is noted that any value of the bias voltage is not specified at all in FIG. 2 of the publication.

JP-B 7-60767 mentioned above, too, does not show that the orbital motion or a negative bias voltage is applied to a substrate during reactive sputtering. The publication states that, in order to obtain excellent soft magnetic properties, the relative intensity ratio of Fe (200) peak to Fe (110) peak should be at least 1 as found by X-ray diffractometry; in another parlance, it is essentially required that the thin film be subjected to preferential orientation on the (100) plane. Illustrated in FIG. 5 of the publication is an X-ray diffraction pattern of a soft magnetic thin film annealed at 600° C. As shown, the relative intensity ratio of Fe (200) peak to Fe (110) peak is 3.1. As also shown, there is a distinctive, broad peak for ZrN. Referring to a mechanism by which soft magnetic properties are improved, the publication states that the growth of crystal grains can be limited by the precipitation of fine grains of ceramics such as ZrN at an Fe grain boundary. To achieve the precipitation of fine grains of the ceramics at the Fe grain boundary, annealing at a temperature exceeding 300° C. is essentially needed. In addition, the precipitation of ZrN offers another problem, i.e., a drop of corrosion resistance due to the precipitation of α-Fe.

JP-A 3-1513 mentioned above, too, does not show that the orbital motion or a negative bias voltage is applied to a substrate during reactive sputtering. According to the publication, as long as 4,800 minutes are needed for crystallization when annealing is carried out at 250° C. In addition, the coercive force obtained at that time is as high as 1.4 Oe. Illustrated in FIG. 11 of the publication is an X-ray diffraction pattern change due to a change in the annealing temperature. As can be seen from FIG. 11, a broad peak for Fe (200) is present when the annealing is carried out at a high temperature of 450° C. or greater. However, such an Fe (200) peak is not substantially observed when the annealing is performed in a region of temperature that is lower than 450° C. Even upon annealed at 500° C., the I(200) to I(110) ratio as defined in the present invention does not reach 0.1. Also, the publication states that if the annealing temperature is at least 350° C., a coercive force of 10 Oe or lower is obtained while a diffraction peak for ZrN is observed. In other words, it is believed that in order that the soft magnetic thin film set forth in the publication has good-enough soft magnetic properties, the presence of ZrN is required as in the case of the soft magnetic thin film disclosed in JP-B 7-60767. In the invention set forth in JP-A 3-1513, no Fe (200) peak is found upon annealed at 250° C. Nor is such excellent soft magnetic properties as mentioned above obtained. The reason appears to be due to the fact that the nitrogen content is too much higher than that of the composition defined in the present invention.

Incidentally, JP-A 6-259729, too, describes a soft magnetic thin film having an Fe—Zr—N base composition. As described, this thin film is applied to a magnetic shielding film in MR heads or an MR induction type of composite heads. The publication does not show that the orbital motion or a negative bias voltage is applied to a substrate during reactive sputtering. Nor does the publication show the application of the thin film to a magnetic pole in induction head portions. Moreover, the publication provide neither reference to the stress of the soft magnetic thin film nor illustration of an X-ray diffraction pattern of the soft magnetic thin film. However, the publication states that the soft magnetic thin film should be subjected to preferential orientation on the (100) plane. The publication goes on that the soft magnetic thin film has an increased thermal stability because the growth of Fe crystal grains is limited by the formation of ZrN. In this soft magnetic thin film, too, ZrN is formed as is the case with JP-B 7-60767 and JP-A 3-1513.

However, JP-A 6-259729 says nothing about whether or not the soft magnetic thin film has been annealed. If any annealing is dispensed with, the soft magnetic thin film is suitable for MR heads or an MR induction type of composite heads. However, experiments performed by the inventors indicate that it is very difficult to obtain thin films oriented on the (100) plane unless annealing is performed, and so most of them will be oriented on the (110) plane due to slight variations in film-forming conditions such as a partial pressure of nitrogen, power input, and the degree of vacuum at a reactive sputtering step. In the absence of annealing, it is impossible to form ZrN in a stable manner. In the absence of annealing as well as stress control such as one according to the present invention, delamination is likely to occur, and this is particularly true of a magnetic pole or other thick layer structure.

Some preferred embodiments of the present invention will now be explained at great length.

The process for fabricating a soft magnetic thin film according to the present invention comprises a step of forming a thin film composed of a metal nitride on a substrate by means of reactive sputtering.

At the reactive sputtering step, sputtering is performed in an argon or other inert gas atmosphere, using a cast alloy target or multiple targets and employing nitrogen as a reactive gas. Preferably, the sputtering atmosphere contains nitrogen in an amount of 0.1 to 15% by volume, and particularly 2 to 10% by volume. At too high or too low a nitrogen content, it is difficult to obtain a thin film which, for instance, has an Fe—Zr—N base composition, and is excellent in soft magnetic properties, because difficulty is involved in allowing y in the composition formula to be given later to have a value within the scope of the present invention.

At the reactive sputtering step, the substrate is moved relatively to the target in such a manner that the substrate is periodically opposite to the target, and/or a negative bias voltage is applied to the substrate.

In order to allow the substrate to be periodically opposite to the target, it is preferable that the substrate is held on a rotating substrate holder at a position having an off-axis relation to a rotary shaft thereof and the target is fixed at a position that has an off-axis relation to the rotary shaft of the substrate holder and can be periodically opposite to the substrate in association with the rotation of the substrate holder. Specifically, it is preferable to use a substrate holder of the structure shown in FIG. 5. As illustrated, a plurality of substrates 12 are held on a substrate holder 13, so that the substrates can be successively opposite to a target in association with the rotation of the substrate holder. This structure is further advantageous in that films can be simultaneously formed on a plurality of substrates by means of sputtering.

No particular limitation is placed on the speed, etc. of the aforesaid relative movement of the substrate. Specifically, the speed of movement of the substrate is not critical because of varying depending on the stress of a thin film formed while the substrate remains fixed, and various conditions such as the value of the negative bias voltage applied to the substrate, and the material of the substrate. Thus, the speed of movement of the substrate may be determined such that a thin film having desired stress is formed. When, for instance, rotary motion like the aforesaid orbital motion is applied to the substrate, however, it is generally preferred that the rotating speed of the substrate holder is up to 20 rpm, and particularly 0.5 to 15 rpm. It is noted that rotational motion, not the orbital motion, may be applied to the substrate.

The value of the negative bias voltage applied to the substrate is again not critical because of varying depending on the stress of a thin film formed while the substrate remains fixed, and various conditions such as the speed of movement of the substrate, and the material of the substrate. Thus, that value may be determined such that a thin film having desired stress is formed. However, it is preferable to use a negative bias voltage of at least −300 V, and particularly −150 to −10V. It is noted that DC or RF power sources may be used for the generation of the negative bias voltage.

No particular limitation is imposed on how to perform sputtering as well as on the sputtering systems used. It is preferable, however, to use a magnetron sputtering system. Although either DC sputtering or RF sputtering may be used, yet it is preferable to make use of DC sputtering because a stress change in association with the aforesaid relative movement of the substrate becomes generally small when RF sputtering is performed. It is noted that the working pressure may be usually on the order of about 0.05 to 1.0 Pa. Various conditions such as power input for sputtering, and the distance between the substrate and the target may be optionally determined.

The type of the substrate to be formed thereon with thin films is not critical. The soft magnetic thin film formed according to the present invention is preferably applied to magnetic poles or magnetic shielding films in such magnetic heads as will be described later. In this case, the substrate may be made up of an insulating material composed of $Al_2O_3$ or $SiO_2$, a metal such as permalloy, and the like.

The thin film formed by means of reactive sputtering may be of either crystalline nature or amorphous nature.

The thin film formed by sputtering may be annealed if necessary. This annealing is carried out at less than 300° C. when the soft magnetic thin film formed according to the present invention is applied to a magnetic head comprising an MR head portion. The annealing may be carried out to crystallize the thin film to give soft magnetic properties thereto or improve the soft magnetic properties of the thus crystallized film, or for other purposes.

The present invention may be applied to the formation of soft magnetic thin films composed of various metal nitrides; however, it is preferred that the present invention is applied to the formation of an Fe—N base thin film in particular. It is also preferably applied to the formation of an Fe—N base thin film wherein a portion of iron is substituted by nickel, cobalt, and other metal element represented by M as will be described later.

A preferred embodiment of the soft magnetic thin film formed according to the present invention, i.e., an Fe—Zr—N base soft magnetic thin film will now be explained.

This soft magnetic thin film has a composition represented by the following formula:

In the above formula, M is at least one element selected from the group consisting of magnesium or Mg, calcium or Ca, yttrium or Y, titanium or Ti, zirconium or Zr, hafnium or Hf, vanadium or V, niobium or Nb, tantalum or Ta, chromium or Cr, molybdenum or Mo, tungsten or W, manganese or Mn, and boron or B, with the proviso that M is preferably at least one element selected from the group consisting of Zr, V, Ta and Ti, and more preferably Zr. It is preferable that M contains at least 20 at % of Zr. N is nitrogen. The atomic ratio x is $0.01 \leq x \leq 0.1$ and preferably $0.02 \leq x \leq 0.09$, and the atomic ratio y is $0.01 \leq y \leq 0.1$ and preferably $0.02 \leq y \leq 0.09$.

The soft magnetic thin film of the present invention has an I(200)/I(110) ratio of 0.1 inclusive to 1 exclusive, and preferably 0.15 to 0.8 inclusive with the proviso that I(200), and I(110) represent an intensity of a diffraction peak for an Fe (200) plane, and an Fe (110) plane, respectively, as found by X-ray diffractometry. Preferably, the soft magnetic thin film is substantially free from a diffraction peak for a nitride of M such as ZrN, as found by X-ray diffractometry.

Herein let 2θ (θ is the diffraction angle) denote the position of each peak when a CuK α-beam is used for X-ray diffractometry. Then, 2θ is about 65° for Fe (200), about 44° for Fe (110), and about 39° for ZrN (200).

The element M, especially Zr is effective for keeping the I(200)/I(110) ratio within the scope defined herein. The element M is also effective to cooperate with N to refine crystals.

When the value of x in the above formula is too small, it is impossible to achieve good-enough soft magnetic properties due to too large a grain size. Furthermore, thermal stability, and corrosion resistance becomes worse. When the value of x is too large, on the other hand, high-temperature annealing is needed for crystallization. Even if crystallization is somehow carried out, it is impossible to achieve good-enough soft magnetic properties. Furthermore, it is impossible to obtain high saturation flux density.

When the value of y in the above formula is too small, no good-enough soft magnetic properties are obtainable because the refinement of crystal grains by N becomes insufficient. When the value of y is too large, the annealing for crystallization should be continued at a low temperature over a practically unacceptably long period of time. In addition, even if crystallization is somehow carried out, it is impossible to obtain good-enough soft magnetic properties.

In the practice of the present invention, it is noted that the soft magnetic thin film may contain up to 5 at % of oxygen as a whole.

The composition of the soft magnetic thin film may be determined by the Electron Probe Micro Analysis (EPMA) method, for instance.

The aforesaid soft magnetic thin film can have excellent soft magnetic properties. Specifically, an initial permeability of at least 1,000 at 10 MHz and a coercive force of up to 1 Oe can be obtained with a saturation flux density of at least 14,000 G.

This soft magnetic thin film is formed by the aforesaid fabrication process of the present invention. A thin film formed by reactive sputtering is usually of approximately amorphous nature, and shows a broad peak coming from the Fe (110) plane but does not substantially show any peak derived from the Fe (200) plane. It is then preferred that the peak intensity ratio, I(200)/I(110), is less than 0.1. This peak intensity ratio is increased to the range defined above by subsequent annealing.

The thus formed thin film is annealed to promote the crystallization of the film, thereby obtaining good-enough soft magnetic properties. This annealing is carried out at preferably 100 to 280° C. and more preferably 120 to 260° C. for preferably 0.5 to 20 hours and more preferably 2 to 8 hours. At too low a annealing temperature the crystallization of the film becomes insufficient, and so the film cannot have good-enough soft magnetic properties. Too high an annealing temperature, on the other hand, has a thermally adverse influence on other members in a magnetic head, especially an MR film. Especially for a multilayer structure comprising laminated thin films, the annealing should essentially be carried out at such a low temperature. This is because heating makes elements likely to diffuse mutually among the films due to their very small thinness. By heat treating the film having the aforesaid composition at such a low temperature the Fe (200) peak is allowed to appear, so that the I(200)/I(110) ratio can be increased to the range defined herein. Thus, excellent soft magnetic properties are obtainable. It is noted that too high an annealing temperature offers another problem; that is, it gives rise to a corrosion resistance drop due to the precipitation of α-Fe incidental to the precipitation of FeN.

Preferably, the annealing is carried out in vacuo or in an argon or other inert gas atmosphere.

The thin film has a mean grain size of up to 100 nm upon annealed. In this regard, it is easy to achieve a mean grain size of 5 to 50 nm. The mean grain size may be determined by inserting the half bandwidth, $W_{50}$, of the Fe (200) peak measured by X-ray diffractometry in the following Sheller's equation:

$$D = 0.9 \lambda / W_{50} \cos \theta$$

wherein λ is the wavelength of the X-ray used, and θ is the diffraction angle.

An account will hereinafter be given of the construction of a magnetic head to which the soft magnetic thin film formed according to the present invention is applied.

Figure 1:
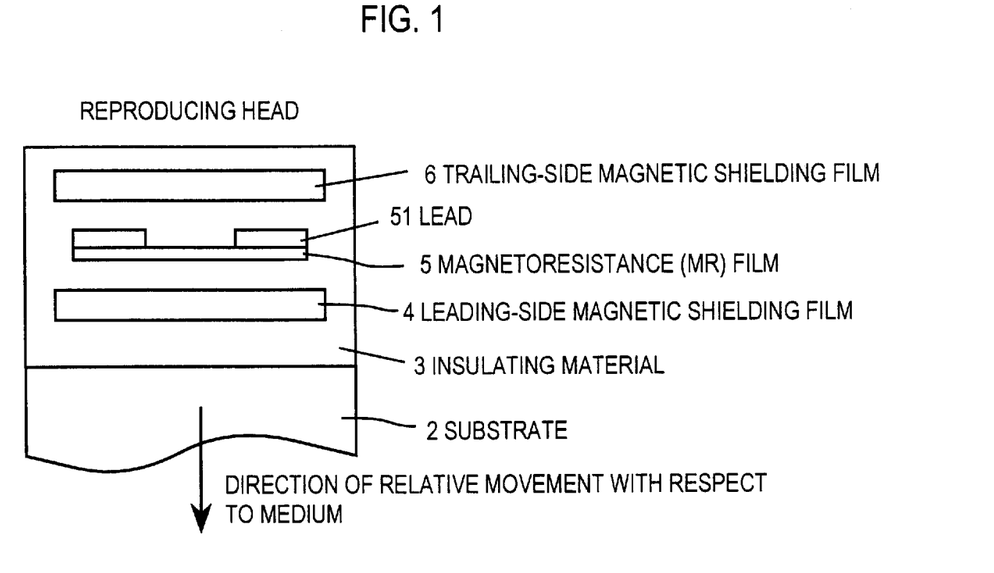
FIG. 1 is a plan view of one exemplary MR head arrangement as taken from a medium side thereof.

FIG. 1 illustrates one exemplary construction of a magnetoresistance (MR) head. FIG. 1 is a plan schematic of the head as taken from a magnetic recording medium side, with a downward arrow indicating the direction of relative movement of the head with respect to the medium. A leading side is defined by a lower side of the head while a trailing side is defined by an upper side of the head. The reproducing head shown in FIG. 1 comprises, in order from a substrate 2 toward the trailing side, a magnetic shielding film 4 on the leading side, an MR film 5 having a pair of leads 51 connected thereto, and a magnetic shielding film 6 on the trailing side, with an insulating layer 3 provided between adjacent film.

The aforesaid soft magnetic thin film may be applied to either the magnetic shielding film on the leading side or the magnetic shielding film on the trailing side. However, it is preferable to apply two such thin films to both magnetic shielding films.

It is noted that the reproducing head shown in FIG. 1 is an ordinary shielded MR head with the MR film 5 exposed on the opposite side of the medium; however, the present invention may be applied to a yoke type MR head such as one shown in FIG. 2. The reproducing head shown in FIG. 2 comprises, in order from a substrate 2 toward a trailing side, a magnetic shielding film 4 on a leading side, an insulating material 31, a yoke 71, an insulating material 32, an MR film 5, a yoke 72, an insulating material 33, and a magnetic shielding film 6 on the trailing side. In this reproducing head, its right-handed side defines a side opposite to a medium, and a magnetic flux passes through the yoke 71, MR film 5, and yoke 72.

The aforesaid soft magnetic thin film is also suitable for an MR induction type composite head comprising a recording induction head portion and a reproducing MR head portion.

Figure 3:
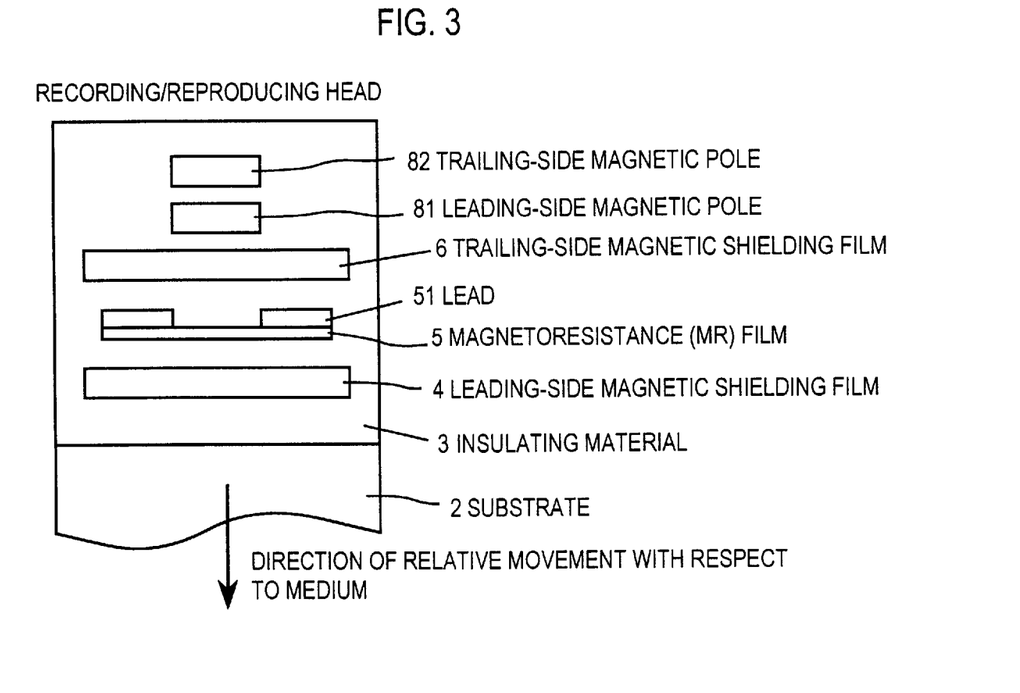
FIG. 3 is a plan view of one exemplary MR induction type composite head as taken from a medium side thereof.

A recording/reproducing head shown in FIG. 3 is one example of the MR induction type composite head in which an induction head portion is provided on the trailing side of the reproducing head shown in FIG. 1 with an insulating material located between them. This induction head portion has an ordinary thin film head construction comprising a magnetic pole 81 on a leading side and a magnetic pole 82 on the trailing side.

Figure 4:
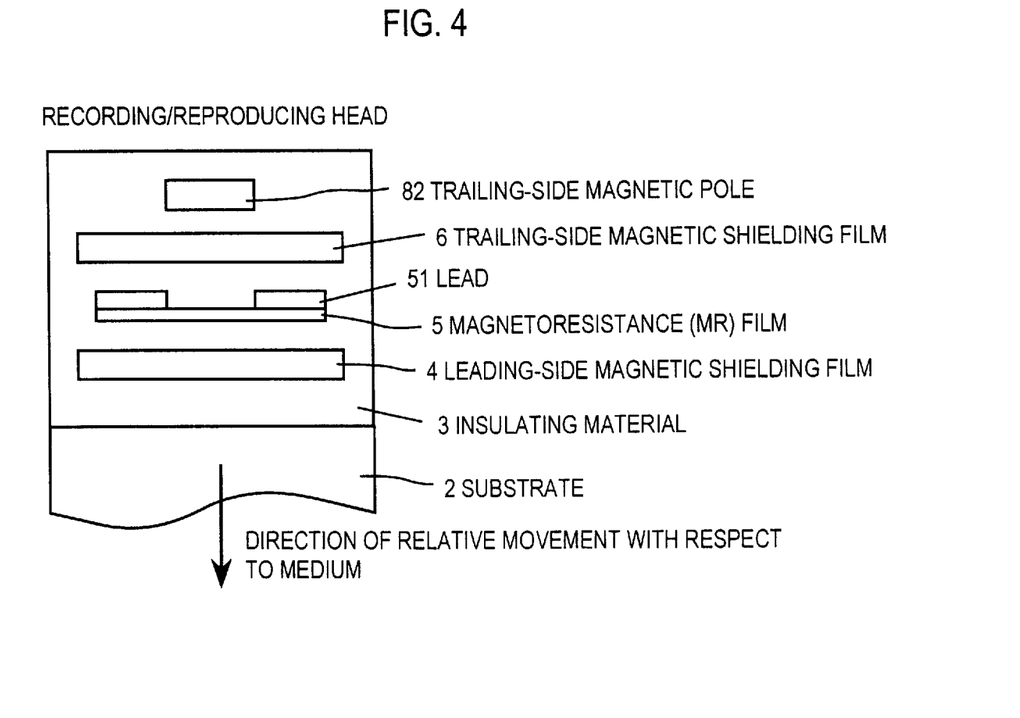
FIG. 4 is a plan view of another exemplary MR induction type composite head as taken from a medium side thereof.

In a recording/reproducing head shown in FIG. 4, on the other hand, the trailing-side magnetic shielding film 6 in the reproducing head shown in FIG. 1 is used as a leading-side magnetic pole in an induction head portion thereof, and a trailing-side magnetic pole 82 for the induction head portion is located on a trailing side thereof.

When the present invention is applied to these induction head portions, the aforesaid soft magnetic thin film is used as magnetic poles. Preferably in this case, two such soft magnetic thin films are applied to both magnetic poles although one such soft magnetic film may be applied to either the magnetic pole on the leading side or the magnetic pole on the trailing side. In any case, it is not always required that the magnetic pole on the leading or trailing side be overall constructed of the aforesaid soft magnetic thin film. For instance, the magnetic pole may be constructed by the lamination of the aforesaid soft magnetic film and other soft magnetic thin film such as a permalloy thin film, and the soft magnetic thin film, which is higher in flux density than the other thin film, may be located on a gap side. With such an arrangement, it is possible to achieve sharper flux changes in the vicinity of the gap.

In these magnetic heads, constructions of parts other than the magnetic shielding films and magnetic poles are not critical, and so may be similar to those of MR heads or an MR induction type composite heads ordinarily used so far in the art.

For instance, not only permalloy or Ni-CO alloys but also various materials having magnetoresistance effect may be used for the MR film. As already mentioned, the present invention is particularly suitable for a multilayer MR film construction because the annealing can be carried out at a low temperature. Exemplary multilayer MR film includes spin valve type films (formed of NiFe/Cu/NiFe/FeMn, Co/Cu/Co/FeMn, etc.), and artificial lattice multilayer films (formed of NiFe/Ag, Co/Ag, etc.).

For the leads connected to the MR film, it is preferred to use tantalum, tungsten or other material which does not diffuse into the MR film. For the insulating materials use may be made of ordinary insulating materials such as various ceramics represented by $Al_2O_3$, and $SiO_2$. The substrate 2 formed as of ceramics is usually fixed to a slider in the magnetic head; however, it is possible to use the substrate 2 per se as the slider.

If necessary, a portion of the magnetic shielding film may be formed of a variety of conventional soft magnetic materials such as permalloy.

The size of each part in the magnetic head is not critical, and so may be determined depending on the construction of the magnetic recording medium used therewith. Usually, the magnetic shielding film is 1 to 5 $\mu$m in thickness and 30 to 200 $\mu$m in width, the magnetoresistance film is 5 to 60 nm in thickness and 1 to 10 $\mu$m in width, the distance between the magnetic shielding film and the magneto-resistance film is 0.03 to 1.0 $\mu$m, the magnetic pole in the induction head portion is 1 to 5 $\mu$m in thickness and 0.5 to 10 $\mu$m in width, and the distance between the trailing-side magnetic shielding film and the magnetic pole in the induction head portion is 0.2 to 5 $\mu$m.

How to operate the MR film in the MR head portion in a linear fashion is not critical. A choice may be made among current bias, hard film bias, soft film bias, shape bias, and other suitable fashions.

The aforesaid magnetic head is usually fabricated by thin film fabrication, and pattern lithography. Each film may be fabricated by suitable techniques such as sputtering, vapor phase evaporation such as vacuum evaporation, and plating. The pattern lithography may be carried out by selective etching, selective deposition, or the like.

The aforesaid magnetic head is used in combination with a well-known assembly such as an arm.

The present invention will now be explained in further detail with reference to some specific examples.

Stress of Thin Film

A thin film having a composition of 88.45 Fe—6.70 Zr—4.85 N (in at %) was formed on a glass substrate in the following procedure.

Figure 6:
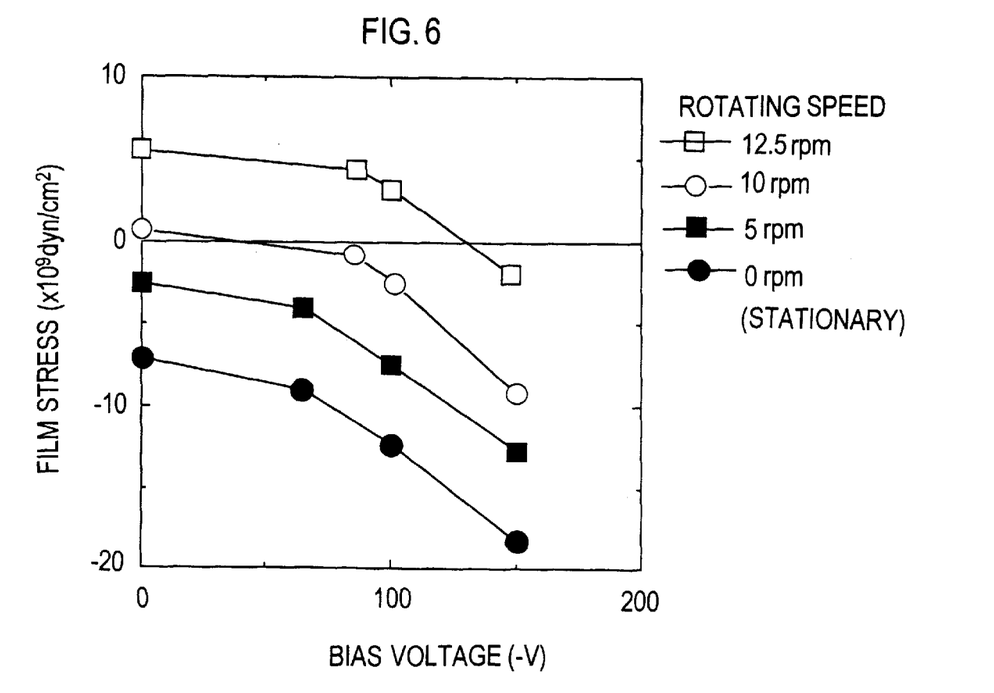
FIG. 6 is a graph showing typical relationships between the rotating speed of a substrate and a bias voltage applied to the substrate, and the stress of a thin film according to the present invention.

An Fe—Zr—N thin film of 1.0 $\mu$m in thickness was first formed on a glass substrate of 300 $\mu$m in thickness by reactive sputtering using an Fe-Zr alloy as a target while a gaseous mixture of Ar+$N_2$ was introduced into a vacuum tank. Used for sputtering was a sputtering system of the structure shown in FIG. 5, in which the orbital motion could be given to the substrate. The rotating speed of the substrate and the bias voltage applied to the substrate, both used for sputtering, are shown in FIG. 6. It is noted that the bias voltage was applied to the substrate by the application of RF power thereto. For sputtering, the flow ratio $N_2/(Ar+N_2)$ was 0.1, the gas pressure was 0.20 Pa, the target power input was 1.4 kW, the diameter of the substrate was 20 mm, the diameter of the target was 203 mm, and the distance between the target and the substrate was 120 mm.

Then, the thin film was annealed at 250° C. for 5 hours.

After the annealing, the stress of the thin film was measured. The stress was determined from the amount of warpage in the glass substrate. The results are plotted in FIG. 6, from which it is found that whether rotary motion is given to the substrate or the negative bias voltage is applied to the substrate, the stress of the thin film can be greatly varied.

A thin film composed of Fe and N was formed in the same manner as mentioned above for stress measurement. It was consequently found that stress control can be performed between about $-10\times10^9$ dyn/cm$^2$ and about $5\times10^9$ dyn/cm$^2$ by giving rotary motion to the substrate, and applying the negative bias voltage to the substrate.

Magnetic Properties of Thin Film

Figure 7:
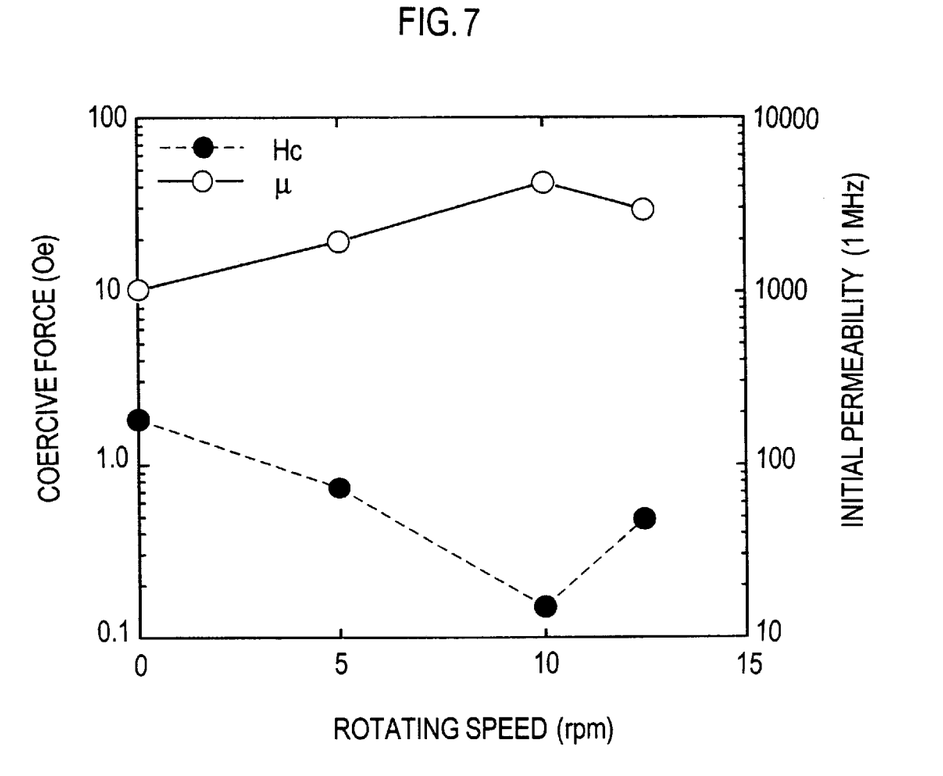
FIG. 7 is a graph showing typical relationships between the rotating speed of a substrate, and the coercive force and initial permeability of a thin film formed according to the present invention.

A substrate was prepared by forming an $Al_2O_3$ film of 10 $\mu$m in thickness on a surface of an $Al_2O_3$—TiC substrate material. A thin film having the aforesaid composition was formed on the $Al_2O_3$ film while the DC bias voltage applied to the substrate was fixed at −85 V and the rotating speed of the substrate was changed. Then, the thin film was annealed, and measured for changes in coercive force Hc and initial permeability $\mu$ at 1 MHz. Other sputtering conditions, and annealing conditions were exactly the same as mentioned above. The results are plotted in FIG. 7, from which it is found that excellent soft magnetic properties can be achieved by proper selection of the rotating speed of the substrate.

X-Ray Diffraction Pattern of Thin Film

Figure 8:
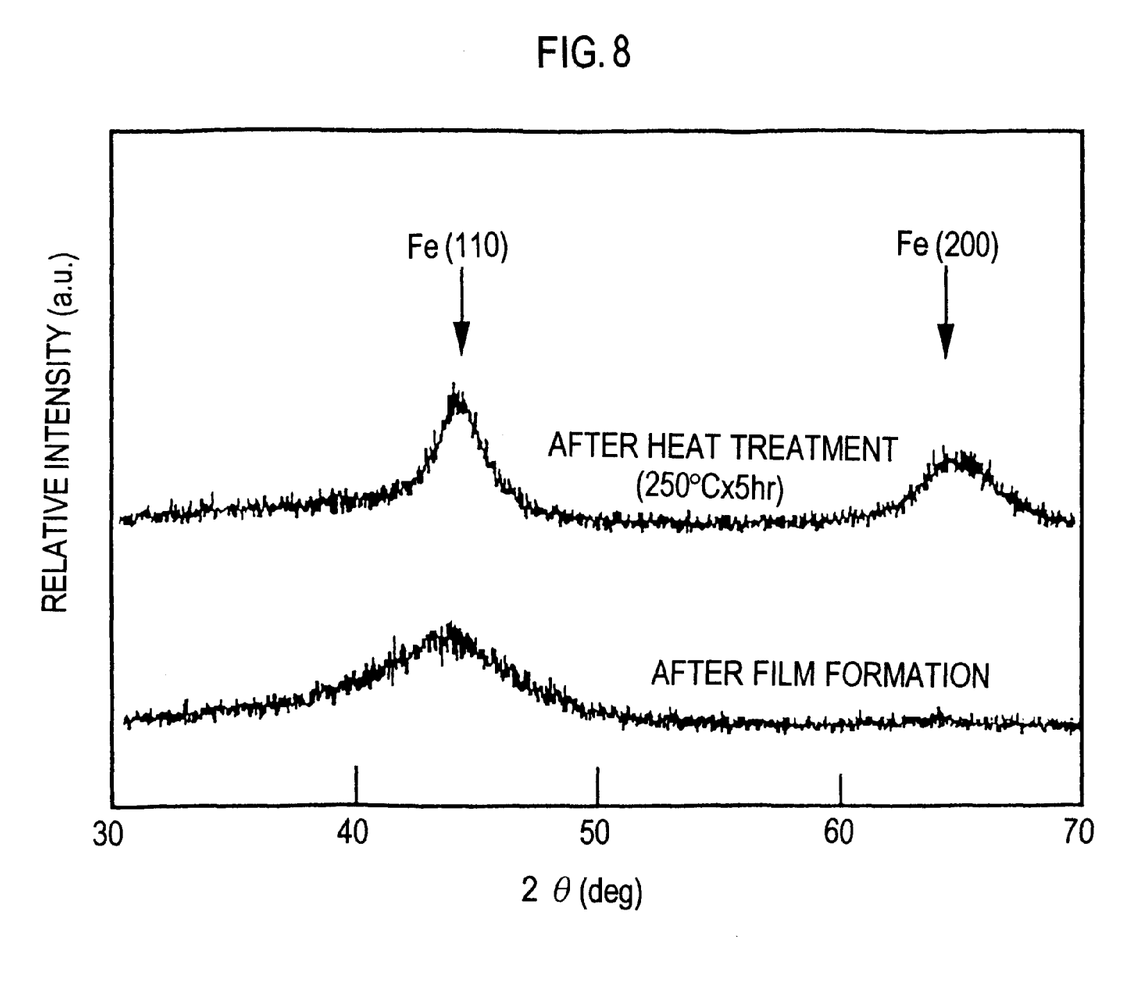
FIG. 8 shows X-ray diffraction patterns of an Fe—Zr—N thin film formed while a substrate is rotated with a negative bias voltage applied thereto, as found before and after annealing.

A thin film having the aforesaid composition was formed on a substrate while the substrate was rotated at 10 rpm and a bias voltage of −100 V was applied to the substrate. Then, the thin film was annealed at 250° C. for 5 hours. It is noted that the substrate used was an $Al_2O_3$—TiC substrate having an $Al_2O_3$ film formed on its surface. Shown in FIG. 8 are X-ray diffraction patterns of the thin film before and after the annealing. From FIG. 8, I(200)/I(110) was found to be 0.50 after the annealing. For the purpose of comparison, a thin film was prepared in the same manner as mentioned above, with the exception that the substrate was not rotated in the absence of bias voltage. Then, the thin film was annealed in the same manner as mentioned above, and an X-ray diffraction pattern thereof was examined. This thin film was found to have a I(200)/I(110) ratio of 0.27 after the annealing. From these results, it is found that the Fe (200) peak is enhanced by the present invention. It was noted that neither of the X-ray diffraction patterns shows a diffraction peak for ZrN. The magnetic properties of both thin films were measured. It was consequently found that the thin film shown in FIG. 8 has a coercive force of 0.2 Oe and an initial permeability of 3,470 at 10 MHz, whereas the comparative thin film has a coercive force of 1.0 Oe and an initial permeability of 1,080.

Comparison on Substrate Basis

Three substrates were provided, i.e., a substrate having an $Al_2O_3$ film formed on an $Al_2O_3$—TiC substrate material, a substrate having an NiFe (permalloy) film laminated on this $Al_2O_3$ film, and a glass substrate. An Fe—Zr—N thin film was formed on the surface of each substrate, and then annealed at 250° C. for 5 hours. During reactive sputtering, the rotating speed of the substrate was 10 rpm, while the bias voltage applied to the substrate was −85 V. Other conditions were exactly the same as mentioned above. Each thin film was measured for coercive force, and initial permeability at 1 MHz. The results are shown in Table 1.

TABLE 1

| Thin Film No. | Substrate | Coercive Force (Oe) | Initial Permeability (1 MHz) |
|---|---|---|---|
| 101 | $Al_2O_3$—TiC/$Al_2O_3$ | 0.12 | 6,560 |
| 102 | Glass | 1.95 | 980 |
| 103 | $Al_2O_3$—TiC/$Al_2O_3$/NiFe | 0.50 | 3,580 |

From Table 1, it is found that the soft magnetic properties of the thin films formed under the same conditions vary largely depending on the type of the substrates used therewith. From FIG. 6 in which the rotating speed of the substrates and the values of the negative bias voltage are plotted, it is understood that the thin film formed under these conditions is substantially relieved of stress. Nonetheless, no good soft magnetic properties are obtained when the thin film is formed on the glass substrate. This teaches that the optimum stress must be imparted to the thin film while care is taken of the underlaid substrate.

While it was possible to form even on a glass substrate a thin film having excellent soft magnetic properties when the rotating speed of the substrate and the value of the negative bias voltage applied thereto were changed, it was noted that the soft magnetic properties of the thin film formed on the $Al_2O_3$ film under the same conditions are not good. It was also noted that by regulating the rotating speed of the substrate and the bias voltage applied it is possible to obtain properties better than those shown in Table 1 even on a permalloy film.

MR Induction Type Composite Head

An MR induction type composite head of the structure shown in FIG. 4 was fabricated.

Formed on the substrate 2 ($Al_2O_3$—TiC) in the first place were an insulating material ($Al_2O_3$ of 10 μm in thickness), the leading-side magnetic shielding film 4 (an Fe—Zr—N thin film having the aforesaid composition and a thickness of 3 μm), an insulating material ($Al_2O_3$ of 0.1 μm in thickness), the MR film 5 (a three-layer structure of 15-nm thick bias film/7-nm thick Ta film/17-nm thick NiFe film with a total thickness of 39 nm and a height of 2.0 μm), the leads 51 (Ta of 0.2 μm in thickness), an insulating material ($Al_2O_3$ of 0.1 μm in thickness), and the trailing-side magnetic shielding film 6 (an Fe—Zr—N thin film having the aforesaid composition and a thickness of 2.5 μm). Both magnetic shielding films were formed by reactive sputtering, and then annealed at 250° C. for 5 hours. It is noted that during the reactive sputtering for forming the magnetic shielding films, the rotating speed of the substrate was 10 rpm and the bias voltage applied to the substrate was −100 V. The MR film, insulating materials, and leads were formed by sputtering while ion milling was used for pattern lithography.

Then, an insulating material ($Al_2O_3$ of 0.5 μm in thickness) was formed by sputtering to form a gap, and the trailing-side magnetic pole 82 (an Fe—Zr—N thin film having the aforesaid composition and a thickness of 3 μm) was formed by reactive sputtering, followed by a five-hour annealing at 250° C. For the reactive sputtering used to form the magnetic pole, the rotating speed of the substrate and the bias voltage on the substrate, shown in Table 2, were used. Then, an insulating material ($Al_2O_3$ of 50 μm in thickness) was formed by sputtering into a protective film, thereby obtaining an MR induction type composite head. Finally, this MR induction type composite head was fixed at the substrate 2 to a slider for incorporation into a hard disc driver.

It is noted that the annealings for the magnetic shielding films and magnetic pole were carried out in vacuo with the application thereto of a magnetic field of 3 kOe parallel with their film surfaces.

These magnetic heads were examined as to whether or not the delamination of the trailing-side magnetic poles from the insulating materials occurred. The results are shown in Table 2.

TABLE 2

| Magnetic Pole No. | Rotating Speed of Substrate (rpm) | Bias Voltage (V) | Delamination from Substrate |
|---|---|---|---|
| 201 | 0 | 0 | found |
| 202 | 0 | −85 | found |
| 203 | 5 | 0 | not found |
| 204 | 5 | −100 | found |
| 205 | 10 | 0 | not found |
| 206 | 10 | −100 | not found |
| 207 | 12.5 | 0 | found |
| 208 | 12.5 | −100 | not found |

From Table 2, it is understood that by controlling the rotating speed of the substrate and the bias voltage to the substrate it is possible to prevent any delamination of the magnetic pole.

Provided for the fabrication of the aforesaid magnetic head was the step of cutting the substrate after the formation of the soft magnetic thin film while water was jetted thereto. However, it was found that the soft magnetic thin film in the magnetic head is substantially free of corrosion when the annealing is done at 250° C. When the thin film having the same composition was annealed at 350° C., in contrast, it was observed that the soft magnetic thin film in the magnetic head is rusted probably due to the oxidation of α-Fe.

It was noted that even when the present invention is applied to magnetic heads of the structures shown in FIGS. 1, 2 and 3, similar results as mentioned above are obtained.

We claim:

1. A process for fabricating a soft magnetic thin film, which comprises:
   a) forming a thin film composed of a metal nitride on a substrate by means of reactive sputtering, wherein
      said thin film is stress controlled at said reactive sputtering step by causing relative movement of said substrate with respect to a target in such a manner that said substrate is periodically opposite to said target, and a negative bias voltage is applied to said substrate,
      and further wherein said relative movement of said substrate is performed while said substrate is held on a rotating substrate holder at a position having an off-axis relation to a rotary shaft thereof, and said target being fixed at a position having an off-axis relation to the rotary shaft of said substrate holder and which is periodically opposite to said substrate in association with rotation of said substrate holder; and b) annealing said formed thin film, to promote crystallization of said film and wherein said negative bias voltage is from −10 V to −150 V, said annealing temperature is from 100 to 280° C. and said substrate holder is rotated at a speed of about 0.5 to 20 rpm.

2. The process for fabricating a soft magnetic thin film according to claim 1, wherein:

a thin film is formed by said reactive sputtering, said thin film containing iron, M that represents at least one element selected from the group consisting of magnesium, calcium, yttrium, titanium, zirconium, hafnium, vanadium, niobium, tantalum, chromium, molybdenum, tungsten, manganese, and boron, and nitrogen, and having a I(200)/I(110) ratio of less than 0.1 with the proviso that I(200), and I(110) represents an intensity of a diffraction peak for an iron (200) plane, and an iron (110) plane, respectively, as found from an X-ray diffraction pattern, and said thin film is then annealed at 100 to 280° C. to obtain a soft magnetic thin film having a composition represented by formula $(Fe_{1-x}M_x)_{1-y}N_y$ wherein an atomic ratio x is $0.01 \leq x \leq 0.1$ and an atomic ratio y is $0.01 \leq y \leq 0.1$, and having a I(200)/I(110) ratio of 0.1 inclusive to 1 exclusive and being substantially free from a diffraction peak for a nitride of M, as found from an X-ray diffraction pattern.

3. The process for fabricating a soft magnetic thin film according to claim 1, wherein said soft magnetic thin film is applied to at least a portion of at least one of a pair of magnetic poles in a magnetic head comprising an induction head portion having said pair of magnetic poles.

4. The process for fabricating a soft magnetic thin film according to claim 1, wherein said soft magnetic thin film is applied to at least a portion of at least one magnetic shielding film in a magnetic head comprising a magnetoresistance head portion having a magnetoresistance film and said at least one magnetic shielding film.

5. The process for fabricating a soft magnetic thin film according to claim 1, wherein said reactive sputtering utilizes a sputtering atmosphere containing nitrogen in an amount of 0.1–15% by volume.

6. The process for fabricating a soft magnetic thin film according to claim 5, wherein said sputtering atmosphere contains nitrogen in an amount of from 2–10% by volume.

7. The process for fabricating a soft magnetic thin film according to claim 1, wherein said annealing is conducted for from 0.5 to 20 hours.

8. The process for fabricating a soft magnetic thin film according to claim 7, wherein said annealing is conducted for from 2 to 8 hours.

9. The process for fabricating a soft magnetic thin film according to claim 1, wherein said substrate holder is rotated at a speed of from 0.5 to 15 rpm.

10. The process for fabricating a soft magnetic thin film according to claim 9, wherein said substrate holder is rotated at a speed of from 5 to 12.5 rpm, and a negative bias voltage of −100 V is applied to said substrate.

* * * * *